United States Patent [19]

Dupraz

[11] Patent Number: 4,848,910
[45] Date of Patent: Jul. 18, 1989

[54] SAGNAC TYPE OPTICAL FIBER INTERFEROMETER SYSTEM

[75] Inventor: Jean-Pierre Dupraz, Aix les Bains, France

[73] Assignee: Alsthom, Cedix, France

[21] Appl. No.: 200,868

[22] Filed: Jun. 1, 1988

[30] Foreign Application Priority Data

Jun. 11, 1987 [FR] France ................................. 8708135

[51] Int. Cl.$^4$ ................................................ G01B 9/02
[52] U.S. Cl. ..................................... 356/350; 356/345
[58] Field of Search ................................. 356/350, 345

[56] References Cited

FOREIGN PATENT DOCUMENTS 0206866 12/1986 European Pat. Off. .

Primary Examiner—Vincent P. McGraw
Assistant Examiner—S. A. Turner
Attorney, Agent, or Firm—Sughrue, Mion, Zinn, Macpeak & Seas

[57] ABSTRACT

The optical fiber interferometer system is used either in a gyroscope or else for measuring electrical current by the Faraday effect. It includes an optical board (100) which is connected to the two ends of a monomode optical fiber (200) constituting an interferometer ring, said optical board including a photodetector (103) which is colinear with the light source which is coupled by both its front and its rear faces. The two counter-propagating beams travelling round the interferometer ring have their relative phase difference modulated by phase modulation and their light power modulated by amplitude modulation. An electronics board (300) generates these modulations and, from the photodetector signal (103), it extracts a component at the lower beat frequency between said two modulation frequencies, thereby making it possible to measure the relative phase difference between the two beams.

3 Claims, 1 Drawing Sheet

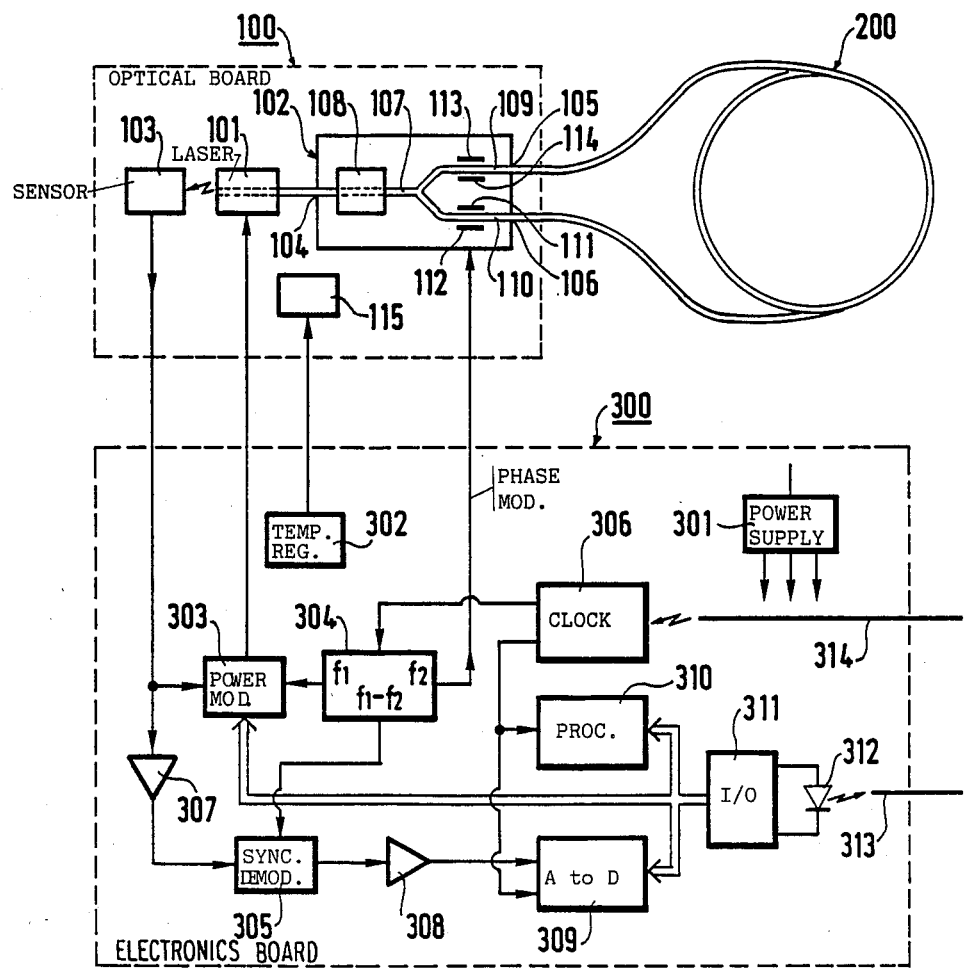

SAGNAC TYPE OPTICAL FIBER INTERFEROMETER SYSTEM

The present invention relates to Sagnac type interferometer systems used in gyroscopes or for measuring current by the Faraday effect.

BACKGROUND OF THE INVENTION

Such interferometer systems use two light beams coming from the same source, generally a laser type diode, and propagating in opposite directions along the same optical path which is constituted by a monomode optical fiber, prior to interferring on a photodetector. They serve to show up non-reciprocal phase changes which depend on the direction of beam propagation and which are due to the Sagnac effect in a gyroscope or to the Faraday effect when measuring a current, and this takes place preferentially compared with reciprocal changes in phase which are due to various disturbances encountered by the beams as they propagate around the interferometer ring and which cancel by compensation at the photodetector.

When special dispositions are not taken, the optical power of the two beams at the photodetector gives rise to a D.C. component and to a component which is proportional to the cosine of their relative phase difference, and this suffers from the drawback of imparting to the photodetector a cosine detection law with zero sensitivity at the origin. In order to eliminate this drawback, it is conventional to apply periodic and symmetrical phase modulation to the two beams running round the interferometer ring, said modulation having a period $2\tau$ of twice the time $\tau$ taken by the beams to run around the interferometer ring. As described in published French patent application number FR-A-2 471 583, such phase modulation gives rise, at the photodetector, to a signal having a component of frequency $\frac{1}{2}\tau$ which is proportional to the sine of the relative phase difference between the two beams, thereby giving rise to maximum sensitivity at the origin over a range of small relative phase differences.

In addition to using phase modulation of the beams from which they are constituted, Sagnac type interferometer systems employed in gyroscope applications or for measuring current by the Faraday effect generally make use of an integrated optical Y-coupler for separating the source light wave into two beams prior to applying it to the optical fiber constituting the interferometer ring, and also serving to recombine the two output beams from the interferometer ring, together with a directional coupler for separating the light wave from the source and the two return beams from the interferometer ring.

Such integrated optical devices are preferred over conventional optical solutions because of their advantages of insensitivity to vibration, compactness, . . . , but they never-the-less suffer from the drawback of having non-negligible absorption coefficients and of being relatively difficult to implement. That is why proposals have already been made, in particular in French patent applications number FR-A-2 582 800 to omit the directional coupler by combining the light source and the photodetector in such a manner as to make them colinear, either by making both of them in the form of a single semi-conductor diode which is used alternatively as an emitter and as a detector of light energy, or else by aligning both of them, with the light source being constituted by a semiconductor diode which is coupled via both its front face and its rear face and which is interposed between the photodetector and the Y-coupler, and diode being used alternatively as an emitter and as an amplifier of light energy.

In either case, the semiconductor diode is switched so as periodically to emit light pulses which are as long as possible, i.e. of duration just less than the time $\tau'$ required for the two beams to propagate over their entire go-and-return paths. The switching period $2\tau'$ is then very close to the period $2\tau$ of the phase modulation used for optimizing detection sensitivity since the go-and-return path length covered by the beams between the light source and the interferometer loop is small compared with the path link of the interferometer loop itself. As a result, in the output signal from the photodetector, the various components due to the modulation coming from source switching and coming from phase modulation overlap one another, thereby making it difficult to detect the useful signal.

In said French patent specification FR-A-2 582 800, this difficulty is averted by artificially doubling the propagation time of the two beams on their go-and-return paths by adding an additional length of optical fiber between the source and the Y-coupler, said additional length being equal to one fourth of the length of the interferometer loop.

The object of the present invention is to solve the above-mentioned problem without adding a significant length of optical fiber in order to avoid increasing the bulk of the inter-ferometer system and to avoid reducing light energy efficiency.

SUMMARY OF THE INVENTION

The present invention provides a Sagnac type optical fiber interferometer system comprising:
 an optical fiber constituting an interferometer loop;
 a light source and a photodetector which are colinear;
 optical coupling means for dividing the light wave emitted by the source into two beams, each of which is applied to a respective end of said optical fiber, and for recombining the two beams emmerging from the two ends of said optical fiber into a light wave which is colinear with the light wave emitted by the source but propagating in the opposite direction and directed towards the photodetector;
 phase modulation means imparting periodic and symmetrical phase modulation to the two beams travelling along said optical fiber;
 amplitude modulation means acting on the power emitted by the light source; and
 electronic means for processing the signal from the photodetector;
 the system being characterized in that said electronic means for processing the signal from the photodetector includes a demodulator operating at the lower beat frequency between the frequency of beam phase modulation and the frequency of light source amplitude modulation.

BRIEF DESCRIPTION OF THE DRAWING

An embodiment of the invention is described by way of example with reference to the sole figure of the accompanying drawing which is a block diagram of the optical portion and of the electronic portion of Sagnac interferometer system in accordance with the invention.

MORE DETAILED DESCRIPTION

The interferometer system shown comprises an electronic board 300 and an optical board 100 connected to the two ends of a monomode optical fiber 200 constituting an interferometer loop.

The optical board 100 comprises a laser diode 101 which emits via its front and rear faces, which is coupled via its rear face to a photodetetor 103, and which is coupled via its front face to an integrcated optical technology circuit 102 providing the functions of a polarizer, of a mode filter, of a Y-coupler, and of a phase modulator.

The integrated optical circuit 102 is conventionally constituted by means of an electro-optical substrate including solid light guides in a Y-configuration and electrodes between which an electric field may be set up. It has a common inlet/outlet port 104 which is coupled to the front face of the laser diode 101, and two parallel inlet/outlet ports 105 and 106 which are coupled to the ends of the optical fiber 200 constituting the interferometer ring. The common inlet/outlet port 104 constitutes the polarization-maintaining end of a solid monomode light guide 107 which is transformed into a polarizer in a region 108 by a conventional proton-exchange doping technique or by metal deposition. This solid light guide 107 leads to a Y-junction with two other polarization-maintaining monomode solid light guides 109 and 110 leading to the parallel inlet/outlet ports 105 and 106.

The junction shares out the light energy it receives via the solid light guide 107 in balanced manner between the two light guides 109 and 110, each of which passes between a corresponding pair of electrodes 111 & 112 or 113 & 114 between which an electric field may be developed in order to locally modify the refractive index of the optical material in order to phase modulate the light beams.

The monomode optical fiber 200 constituting the interferometer ring is either a polarization-maintaining monomode optical fiber for gyroscopic purposes in which the Sagnac effect is implemented in the interferometer ring through which the linearly polarized counter-propagating light beams pass, or else a monomode optical fiber having a very high circular birefringence with the end loops acting as quarter-wave filters for the purpose of measuring current where the Faraday effect is implemented in an interferometer ring having circularly polarized counter-propagating light beams passing therethrough.

In this optical circuit, the light wave emitted from the front face of the laser diode 101 penetrates into the integrated optical circuit 102 via the common inlet/outlet port 104, is mode filtered and linearly polarized in the solid light guide 107, and is split into two linearly polarized light beams each of which leaves a respective one of the parallel inlet/outlet ports 105 and 106. These two light beams travel in opposite directions around the optical fiber 200 constituting the interferometer ring, and each of them leaves said fiber with a certain relative phase difference in order to return to the integrated optical circuit 102 via the other one of the parallel inlet/outlet ports after which the beams are reunited and mode filtered. They then return to the laser diode, pass therethrough, and strike the photodetector 103 in conjunction with the light wave which is emitted directly from the rear face of the laser diode.

The optical power P resulting from the recombination of the two light beams of respective optical powers P1 and P2 which have travelled round the optical fiber constituting the interferometer ring in opposite directions, is given by:

$$P = P1 + P2 + 2\sqrt{P1 \cdot P2} \cdot \cos\delta\phi$$

where $\delta\phi$ is the relative phase difference between the two beams after they have travelled round the optical fiber 200 in opposite directions and due to the Sagnac effect or to the Faraday effect.

This power includes a useful component which is proportional to $\cos\delta\phi$ and which suffers from the drawback of having zero sensitivity for small phase differences.

In order to improve this sensitivity, the phase angles of the two counter-propagating beams running round the interferometer ring may be angle modulated in conventional manner in order to obtain equal instantaneous phase differences of opposite sign in the two beams. This phase modulation is obtained by the electro-optical effect by setting up electric fields between the pairs of electrodes 111 & 112 and 113 & 114, which fields are pulsed at one-half of the resonance frequency of the interferometer ring, referred to as the natural frequency of the interferometer. The effect of adding in this phase modulation is to transform the expression for the light power P of the two light beams on return from the interferometer ring as follows:

$$P = P1 + P2 + \sqrt{P1 \cdot P2} \cdot \cos[\delta\phi + \alpha \cdot \cos((2\pi t/2\tau) + \beta)]$$

where $\alpha$ is a modulation index and $\tau$ is the time taken by a light beam to propagate round the interferometer ring.

This light power has a spectrum which is rich in frequency components, and which includes, in particular:

- a D.C. component;
- a component at the frequency $\frac{1}{2}\tau$ of the phase modulation which is proportional to the sine of the relative phase difference $\delta\phi$ giving a sensitivity maximum over the range of small phase differences; and
- a $1/\tau$ component at twice the phase modulation frequency, which component is proportional to the cosine of the relative phase difference $\delta\phi$ and takes on a zero value when the cosine of the relative phase difference is zero.

In optical circuits where the laser diode and the photodetector are not aligned but are mounted by means of a directional coupler, the relative phase difference between the two light beams returning from the interferometer ring is measured from a component at the frequency $\frac{1}{2}\tau$ which is extracted from the photodetector signal by snychronous demodulation.

When the laser diode and the photodetector are aligned or are constituted by the same component, it is conventional to cause the laser diode to emit periodic light pulses of shorter duration than the time required for them to return, and to detect the return optical power of the pulse either by means of the laser diode being transformed into a photodetector between emitting two light pulses, or else by means of a photodetector which receives th return pulse after it passes through the laser diode from its front face to its rear face.

In order to obtain good energy efficiency, it is necessary to use emit and receive light pulses of maximum duration $\tau'$ corresponding to twice the transit time $\tau''$ taken by the light to go from the laser diode to the interferometer ring plus the transit time $\tau$ around the interferometer ring such that:

$$\tau' = 2\tau'' + \tau$$

As a result, the emit-receive switching period $2\tau'$ is very close to the phase modulation period $2\tau$, insofar as the distance between the laser diode and the interferometer ring is much less than the length of said ring, and as a result the spectrum of the signal generated by the photodetector includes spectrum lines in the vicinity of the frequency $\frac{1}{2}\tau$ caused by the modulation due to emit-receive switching of the laser diode, which spectrum lines disturb the detection of the useful spectrum line at $\frac{1}{2}\tau$ generated by the phase modulation.

One known method of elimination this disturbance is to increase the separation between the phase modulation frequency and the laser diode emit-receive switching frequency by extending the path of the light pulse between the laser diode and the interferometer ring by interposing an auxiliary length of monomode optical fiber on said path, said auxiliary length being about one fourth of the length of the optical fiber 200 constituting the interferometer ring. However, this suffers from the drawback of increasing the bulk of the device and of reducing its light energy efficiency.

According to the invention, the useful signal is isolated in a different spectrum line of the signal coming from the photodetector after the phase modulation has been combined with the modulation resulting from laser diode emit-receive switching, or more generally with any amplitude modulation of the light energy emitted by the laser diode.

If the light energy emitted by the laser diode is amplitude modulated by a sinewave at frequency f1, then each of the two light beams entering the interferometer ring is subjected to variation of the following form:

$$P1 = P01 \cdot (1 + m \cdot \sin 2\pi f1 t)$$

$$P1 = P02 \cdot (1 + m \cdot \sin 2\pi f1 t)$$

where P01 and P02 are constants and m is the depth of amplitude modulation, such that the power of the two returning light beams from the interferometer ring gives rise to an equation of the following form, taking account of the phase modulation as well:

$$P = (1 + m \cdot \sin 2\pi f1 t) \cdot [P01 + P02 + 2\sqrt{P01 \cdot P02} \cdot \cos(\delta\phi + \cos((\pi t/\tau) + \beta))]$$

When this relationship is analyzed mathematically by means of Bessel functions, it can be shown that the optical power P of the beams coming from the interferometer ring has frequency spectrum which is very rich in harmonics and which includes a spectrum line at the frequency $|\frac{1}{2}\tau - f1|$ whose power P' is proportional to the relative phase difference angle as follows:

$$P' = \frac{1}{2} \cdot m \cdot PO \cdot J1 \cdot \alpha \cdot \sin\delta\phi \cdot \sin(2\pi |\frac{1}{2}\tau - f1| t + o)$$

where J1 is a first order Bessel function of the first kind and PO is the sum of the light powers PO1 and PO2.

So long as the two modulation frequencies are slightly different, this component exists and may be used for measuring the relative phase difference of the two beams with maximum sensitivity for small phase differences.

The electronics board 300 serves to provide the phase modulation and the amplitude modulation needed to generate this component, to isolate it, and then to exploit it in order to extract the value of the relative phase difference between the two beams returning from the interferometer ring. It may be split into an emit portion generating the electrical signals required for the combined amplitude and phase modulation of the two counter-propagating light beams running round the interferometer ring, and a receive portion for extracting a signal proportional to the relative phase difference between the two counter-propagating beams returning from the interferometer ring from the beats between said beams, a portion for digitally processing the signal from the receive portion and also for transmitting the measurements to outside the interferometer system and possibly for synchronizing said measurement with an external time reference, and a service portion including an electrical power supply 301 and temperature regulation for the optical board 100.

The temperature of the optical board 100 is regulated by a regulation block 302 coupled to temperature measuring elements 115 on the optical board 100.

The emit portion includes a modulator 303 for modulating the optical power of the laser diode 101 and a frequency synthesizing generator 304.

The power modulator 303 is stabilized by a feedback loop including the photodetector 103 coupled to the rear face of the laser diode 101. It is provided with an input for the modulation carrier f1 controlled by an output from the frequency synthesizer 304. The frequency synthesizer 304 has a second output on which it delivers a signal at a frequency f2 equal to $\frac{1}{2}\tau$, thereby controlling the pairs of electrodes 111 & 112 and 113 & 114 of the optical phase modulators in the integrated optical circuit 102, and a third output on which it delivers a frequency $|f1 - f2|$ to a synchronous demodulator circuit 305 in the receive portion. It also has a synchronization input controlled by a clock circuit 306 in the portion for digitally processing the received signal.

The receive portion comprises the synchronize demodulation circuit 305 preceded by an amplifier and filter circuit 307 which is connected to the output from the photodetector 103 which is coupled to the rear face of the laser diode 101. The synchronized demodulator 305 is followed by a further amplifier and filter circuit 308.

The photodetector 103 coupled to the rear face of the laser diode 101 delivers a signal which is proportional to the light power which it receives from the laser diode, either directly, either after it has passed round the interferometer ring and come back through the laser diode. This signal comprises:

a main component at the frequency f1 at which the light power emitted by the diode is modulated, due to the light flux which is directly received from the laser diode via its rear face; and a component at a very much lower amplitude coming from the beats between the two counter-propagating light beams which are modulated both in amplitude and in phase and which have passed back through the laser diode on returning from the interferometer ring, said component satisfying an equation of the following form, as explained above:

$$P = (1 + m \cdot \sin 2\pi f1 t) \cdot [P01 + P02 + 2\sqrt{P01 \cdot P02} \cdot \cos(\delta\phi + \cos((\pi t/\tau) + \beta))]$$

It is filtered and amplified by the circuit 307 in order to extract a component at the frequency $|f1-f2|$ which, as mentioned above, has the following form:

$$P'=\tfrac{1}{2}\cdot m\cdot PO\cdot J1\cdot \alpha\cdot \sin\delta\phi\cdot \sin(2\pi||\tfrac{1}{2}\tau-f1|t+o)$$

which is then applied to the synchronous demodulator 305 and after filtering and amplification by the circuit 308 gives rise to a measurement signal representative of the relative phase difference and having the form:

$$s(t)=k\cdot \sin\delta\phi(t)$$

This technique makes it possible to use amplitude modulation at a frequency f1 which is close to the frequency f2 of the phase modulation. In a gyroscope where the polarization-maintaining monomode optical fiber of the interferometer ring is about 1 kilometer long, the natural frequency of the interferometer and thus of the phase modulation is about 100 kHz and a relatively close frequency, say about 98 kHz, may be considered for amplitude modulating the light energy emitted by the laser diode. This makes it possible, when desirable, to use on/off amplitude modulation in order to separate the emit pulse and the return pulse at the photodetector while requiring only a very short extension to the light beam paths between the laser diode and the interferometer ring, which extension in the present example may be about 10 meters of fiber rather than the 250 meters required in the prior art.

Similarly, in apparatus for measuring current by the Faraday effect with the interferometer ring being a very high circular birefringence monomode optical fiber which is about 10 meters long, the natural frequency of the interferometer and thus of the phase modulation is about 10 MHz, and it is possible to envisage amplitude modulating the light energy emitted by the laser at a frequency of about 9.95 MHz. Under conditions of on/off amplitude modulation of the laser diode for the purpose of separating the emit pulse from the return pulse at the photodetector, this means that the light beam path between the laser diode and the interferometer ring needs to be extended by about 25 cm of fiber rather than the 2.5 meters which were required in the prior art.

The measurement signal representative of the relative phase difference s(t) available at the output from the amplifier circuit 308 is sampled and digitized by an analog-to-digital converter 309 which includes a sample-and-hold circuit and an analog-to-digital converter device operating in conventional manner.

The portion of the electronics board 300 for digitally processing the signal comprises a signal-processing processor 310, a communications processor 311, and the clock circuit 306.

The main role of the signal-processing processor 310 is to extract a value explicitly representative of the relative phase difference between the two counter-propagating light beams coming from the interferometer ring. This value is deduced from the signal s(t) delivered by the receive portion and made available in digital form at the output from the analog-to-digital converter 309. The processor then makes use of the relationships defining the Sagnac effect or the Faraday effect in order to deduce either a value of angular speed if the application is a gyroscope, or else a value of current if current is being measured by the Faraday effect.

The communications processor 311 encodes, serializes, and digitally transmits the result of the instantaneous measurement delivered by the signal-processing processor 310, with external transmission taking place by means of a light emitting diode 312 and a monomode or multimode optical fiber 313.

The clock circuit 306 receives external synchronization via another monomode or multimode optical fiber 314 which is of particular use when the interferometer system is to operate in synchronism with other apparatuses. It also delivers a stable clock signal used by the frequency synthesizing generator 304 in the emit portion in order to generate the modulation carriers f1 and f2, and also the demodulation carrier (f1−f2) at suitable phase positions in order to ensure that the synchronous demodulation circuit 305 operates properly.

Without going beyond the scope of the invention, various dispositions may be modified and various means may be replaced by equivalent means.

I claim:

1. An optical fiber interferometer system comprising:
   an optical fiber constituting an interferometer loop;
   a light source and a photodetector which are colinear;
   optical coupling means for dividing the light wave emitted by the source into two beams, each of which is applied to a respective end of said optical fiber, and for recombining the two beams emmerging from the two ends of said optical fiber into a light wave which is colinear with the light wave emitted by the source but propagating in the opposite direction and directed towards the photodetector;
   phase modulation means imparting periodic and symmetrical phase modulation to the two beams travelling along said optical fiber;
   amplitude modulation means acting on the power emitted by the light source; and
   electronic means for processing the signal from the photodetector;
   wherein said electronic means for processing the signal from the photodetector includes a demodulator operating at the lower beat frequency between the frequency of beam phase modulation and the frequency of light source amplitude modulation.

2. An interferometer system according to claim 1, wherein the demodulator is a synchronous demodulator.

3. An interferometer system according to claim 1, wherein the amplitude modulation is on/off modulation serving to pulse the operation of the light source.

* * * * *